(12) United States Patent
Chen (10) Patent No.: US 8,493,744 B2
(45) Date of Patent: Jul. 23, 2013

(54) SURFACE MOUNT DEVICES WITH MINIMUM LEAD INDUCTANCE AND METHODS OF MANUFACTURING THE SAME

(75) Inventor: Qiang Richard Chen, Phoenix, AZ (US)

(73) Assignee: TDK Corporation, Tokyo (JP)

( * ) Notice: Subject to any disclaimer, the term of this patent is extended or adjusted under 35 U.S.C. 154(b) by 619 days.

(21) Appl. No.: 11/732,543

(22) Filed: Apr. 3, 2007

(65) Prior Publication Data

US 2008/0246157 A1    Oct. 9, 2008

(51) Int. Cl.
   *H05K 7/00*    (2006.01)

(52) U.S. Cl.
   USPC ............ 361/760; 361/301.4; 361/306.3; 361/309; 174/260; 174/261; 333/185; 333/204

(58) Field of Classification Search
   USPC ........... 361/760, 301.4, 306.3, 309; 174/260, 174/261; 333/185, 204
   See application file for complete search history.

(56) References Cited

U.S. PATENT DOCUMENTS

| | | | | |
|---|---|---|---|---|
| 5,111,169 A | * | 5/1992 | Ikeda ............................ | 333/181 |
| 5,126,707 A | * | 6/1992 | Ikeda ............................ | 333/185 |
| 5,138,434 A | * | 8/1992 | Wood et al. ................... | 257/692 |
| 5,162,822 A | * | 11/1992 | Wakamori ..................... | 333/193 |
| 5,173,670 A | | 12/1992 | Naito et al. | |
| 5,224,021 A | * | 6/1993 | Takada et al. ................. | 361/774 |
| 5,278,526 A | * | 1/1994 | Ikeda ............................ | 333/185 |
| 5,451,815 A | * | 9/1995 | Taniguchi et al. ............ | 257/696 |
| 5,519,366 A | | 5/1996 | Kaneko et al. | |
| 5,572,175 A | * | 11/1996 | Tada et al. ..................... | 333/206 |
| 5,696,472 A | * | 12/1997 | Kaida ............................ | 333/189 |
| 5,719,539 A | * | 2/1998 | Ishizaki et al. ................ | 333/204 |
| 5,760,666 A | * | 6/1998 | Tada et al. ..................... | 333/206 |
| 5,912,809 A | * | 6/1999 | Steigerwald et al. ......... | 361/780 |
| 5,939,819 A | * | 8/1999 | Unami et al. ................. | 310/366 |
| 5,985,414 A | * | 11/1999 | Fukuda et al. ................ | 428/192 |
| 6,011,451 A | * | 1/2000 | Gamo ........................... | 333/189 |

(Continued)

FOREIGN PATENT DOCUMENTS

| | | |
|---|---|---|
| JP | 8-102635 | 4/1996 |
| JP | 11-154612 | 6/1996 |

OTHER PUBLICATIONS

American Technical Ceramics; Recommended Attachment Techniques for ATC Multilayer Chip Capacitors; Bulletin 201; ATC#011-119; Jun. 2004; pp. 1-6.

(Continued)

*Primary Examiner* — Xiaoliang Chen (74) *Attorney, Agent, or Firm* — Allen J. Moss; Squire Sanders (US) LLP (57) ABSTRACT

A device according to various aspects of the present invention generally includes a surface mount device having a top side, a bottom side, a plurality of sidewalls, and a circuit comprising one or more layers. The device includes a first conductive surface covering a portion of one of the sidewalls for providing an input to the circuit, a second conductive surface covering a portion of one of the sidewalls for providing an output from the circuit, and a third conductive surface covering a portion of one of the sidewalls for providing an electrical ground to the circuit. When the surface mount device is mounted to a provided mounting surface, at least one layer of the circuit is orthogonal to the provided mounting surface.

36 Claims, 13 Drawing Sheets

U.S. PATENT DOCUMENTS

| | | | |
|---|---|---|---|
| 6,292,351 B1* | 9/2001 | Ahiko et al. | 361/306.3 |
| 6,294,968 B1* | 9/2001 | Ito et al. | 333/202 |
| 6,329,887 B1* | 12/2001 | Baek | 333/193 |
| 6,388,207 B1* | 5/2002 | Figueroa et al. | 174/262 |
| 6,420,945 B1* | 7/2002 | Yamamoto et al. | 333/189 |
| 6,437,664 B1* | 8/2002 | Meppelink et al. | 333/182 |
| 6,444,920 B1 | 9/2002 | Klee et al. | |
| 6,459,048 B1* | 10/2002 | Sakai et al. | 174/261 |
| 6,473,291 B1* | 10/2002 | Stevenson | 361/306.3 |
| 6,545,855 B1 | 4/2003 | Repplinger et al. | |
| 6,621,378 B2* | 9/2003 | Naruse et al. | 333/185 |
| 6,950,300 B2* | 9/2005 | Sutardja | 361/306.3 |
| 7,023,688 B2* | 4/2006 | Kazama | 361/321.1 |
| 7,068,124 B2* | 6/2006 | White et al. | 333/185 |
| 7,180,723 B2* | 2/2007 | Togashi et al. | 361/303 |
| 7,211,740 B1* | 5/2007 | Randall | 174/359 |
| 7,280,342 B1* | 10/2007 | Randall et al. | 361/303 |
| 7,439,840 B2* | 10/2008 | Carastro et al. | 336/200 |
| 7,489,914 B2* | 2/2009 | Govind et al. | 455/168.1 |
| 7,528,621 B2* | 5/2009 | Bhatti | 324/765 |
| 7,532,092 B2* | 5/2009 | Chen | 333/204 |
| 7,961,453 B2* | 6/2011 | Lee et al. | 361/306.3 |
| 2002/0011596 A1 | 1/2002 | Yoshisato et al. | |
| 2002/0028045 A1* | 3/2002 | Yoshimura et al. | 385/50 |
| 2002/0039464 A1* | 4/2002 | Yoshimura et al. | 385/14 |
| 2002/0044029 A1* | 4/2002 | Ritter et al. | 333/172 |
| 2002/0085334 A1* | 7/2002 | Figueroa et al. | 361/301.4 |
| 2002/0105083 A1* | 8/2002 | Sun et al. | 257/758 |
| 2002/0163787 A1* | 11/2002 | Kameda et al. | 361/752 |
| 2002/0186102 A1* | 12/2002 | Gamo | 333/189 |
| 2004/0004571 A1* | 1/2004 | Adachi et al. | 343/700 MS |
| 2004/0022042 A1* | 2/2004 | Mok et al. | 361/792 |
| 2005/0231304 A1* | 10/2005 | White et al. | 333/185 |
| 2005/0248418 A1* | 11/2005 | Govind et al. | 331/179 |
| 2006/0017454 A1* | 1/2006 | Bhatti | 324/765 |
| 2006/0077646 A1* | 4/2006 | Ahn et al. | 361/793 |
| 2006/0114077 A1 | 6/2006 | Mizuno et al. | |
| 2006/0164189 A1* | 7/2006 | Tohya et al. | 333/238 |
| 2006/0215342 A1* | 9/2006 | Montoya et al. | 361/103 |
| 2007/0085108 A1* | 4/2007 | White et al. | 257/173 |
| 2007/0165360 A1* | 7/2007 | Randall et al. | 361/306.3 |
| 2007/0290771 A1 | 12/2007 | Chen | |
| 2007/0296534 A1* | 12/2007 | Carastro et al. | 336/200 |

OTHER PUBLICATIONS

Bussarakons, Tiva; The Hermetic Surface Mount Device (SMD), Its Advantages and Solutions to Assembly Integration; Technical Application Note 1016; International Rectifier, Inc.; 2002; pp. 1-8.

Littelfuse, Inc.; Surface Mount Soldering Recommendations; AN1005; Littelfuse, Inc.; 2004; pp. 1-4.

Poeth, Dean; Introduction to Surface Mount Technology and Surface Mount Devices for the Small Manufacturer and Hobbyist: Prototype Manufacturing, Rework and Repair Technologies; retrieved from Internet http://poeth.com; 2004; pp. 1-10.

* cited by examiner

SURFACE MOUNT DEVICES WITH MINIMUM LEAD INDUCTANCE AND METHODS OF MANUFACTURING THE SAME

DESCRIPTION OF THE INVENTION

1. Field of the Invention

The present invention relates to surface mount devices, and more particularly, to surface mount devices with minimum lead inductance and methods of manufacturing the same.

2. Background of the Invention

Figure 1:
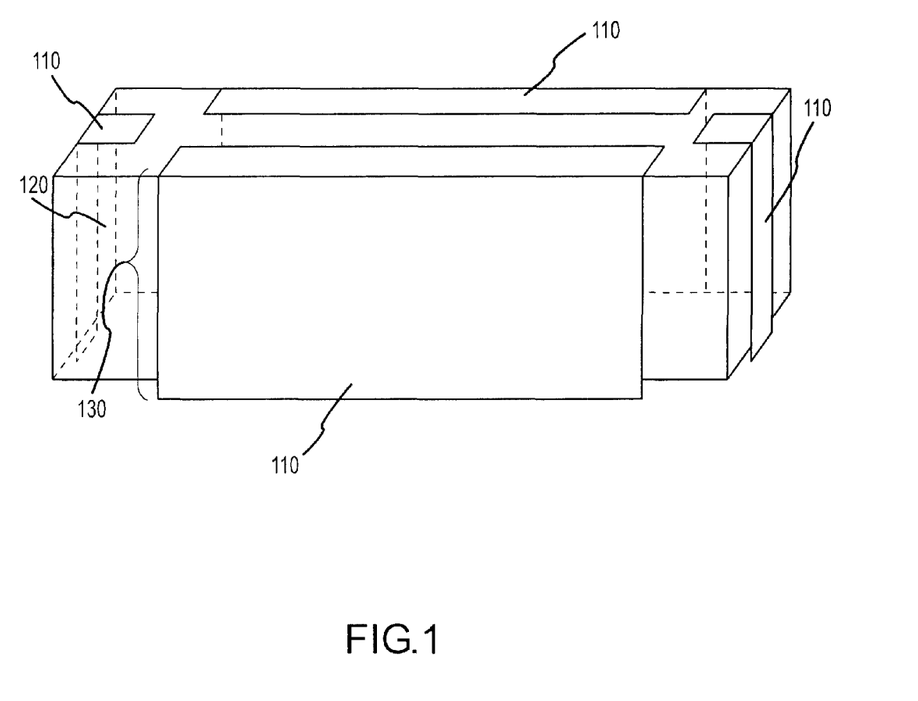
FIG. 1 is a perspective view of a prior art surface mount device (SMD).

Surface mount devices (SMDs) are electronic components used in a wide variety of applications. Traditionally, SMDs use side terminals, also known as leads or terminals, for electrical connection to a mounting surface on a printed circuit board (PCB), substrate, or the like. FIG. 1 depicts a prior art SMD having a plurality of side terminals 110. Typically, conventional SMDs, such as the one shown in FIG. 1, include a circuit (not shown) residing in or on one of more upper layers of the SMD. The bottom surface of the SMD is mounted to a mounting surface (not shown). As shown in FIG. 1, side terminals 110 extend from the top surface of the SMD to the bottom surface of the SMD, thereby connecting the circuit on or near the top of the SMD to conductors on the mounting surface. Consequently, all side terminals 110 connecting the circuit to a mounting surface have a length 130 that is at least the height of the substrate 120.

Side terminals 110 have inherent inductances associated with the length and thickness of the side terminals 110. Such inherent inductance can cause signal distortion and performance degradation, particularly in high frequency SMD applications. Conventional methods of reducing side terminal inductance include reducing the length of the side terminal 110 and using wider and thicker metal traces for the side terminal 110. However, modification of the dimensions of the side terminal 110 may be restricted by factors such as substrate thickness, minimum physical strength requirements, and process requirements. The dimensions of the side terminal 110 may also be restricted by the dimensions of the SMD itself.

Lead inductance can have a detrimental effect on a wide range of SMDs, including Integrated Passive Devices (IPDs). In the case of IPD filters, for example, the associated parasitic inductance due to the length of the leads 110 can seriously deteriorate the filter's out-band rejection performance. Additionally, as SMDs are used at higher frequencies, the effect of the lead inductance is even more significant. Reducing the thickness of the wafer substrate 120 thickness may be helpful to reduce associated lead inductance in these cases, but this technique is of limited use since the substrate 120 must have a minimum thickness to maintain the requisite physical strength for assembly, handling, and system reliability. These and other issues are addressed by the embodiments of the present invention.

SUMMARY OF THE INVENTION

A device according to various aspects of the present invention comprises a surface mount device having a top side, a bottom side, a plurality of sidewalls, and a circuit comprising one or more layers. The device includes a first conductive surface covering a portion of one of the sidewalls for providing an input to the circuit, a second conductive surface covering a portion of one of the sidewalls for providing an output from the circuit, and a third conductive surface covering a portion of one of the sidewalls for providing an electrical ground to the circuit. When the surface mount device is mounted to a provided mounting surface, at least one layer of the circuit is orthogonal to the provided mounting surface.

In another device according to various aspects of the present invention, at least two of the first conductive surface, the second conductive surface, and the third conductive surface cover respective portions of the same sidewall.

In another device according to various aspects of the present invention, each of the first conductive surface, the second conductive surface and the third conductive surface covers a portion of a different one of the plurality of sidewalls.

In another device according to various aspects of the present invention, the third conductive surface is for bonding to the provided mounting surface.

In another device according to various aspects of the present invention, a majority of the third conductive surface is for bonding to the provided mounting surface.

In another device according to various aspects of the present invention, a portion of at least one of the first conductive surface and the second conductive surface is coplanar with the majority of the third conductive surface for bonding to the provided mounting surface.

In another device according to various aspects of the present invention, one of the sidewalls of the surface mount device is for bonding to the provided mounting surface.

In another device according to various aspects of the present invention, the circuit comprises an integrated passive device.

In another device according to various aspects of the present invention, the circuit comprises an integrated active device.

In another device according to various aspects of the present invention, the circuit comprises a filter.

Another device according to various aspects of the present invention further comprises a passivation layer covering at least a portion of the circuit.

A method for manufacturing a device according to various aspects of the present invention comprises providing a surface mount device, wherein the surface mount device comprises a top side, a bottom side, a plurality of sidewalls, and a circuit comprising one or more layers; covering a portion of one of the sidewalls with a first conductive surface, the first conductive surface for providing an input to the circuit; covering a portion of one of the sidewalls with a second conductive surface, the second conductive surface for providing an output from the circuit; and covering a portion of one of the sidewalls with a third conductive surface, the third conductive surface for providing an electrical ground to the circuit, wherein when the surface mount device is mounted to a provided mounting surface, at least one layer of the circuit is orthogonal to the provided mounting surface.

In another method for manufacturing a device according to various aspects of the present invention, at least two of the first conductive surface, second conductive surface, and the third conductive surface cover respective portions of the same sidewall.

In another method for manufacturing a device according to various aspects of the present invention, each of the first conductive surface, the second conductive surface and the third conductive surface covers a portion of a different one of the plurality of sidewalls.

In another method for manufacturing a device according to various aspects of the present invention, the third conductive surface is for bonding to the provided mounting surface.

In another method for manufacturing a device according to various aspects of the present invention, a majority of the third conductive surface is for bonding to the provided mounting surface.

In another method for manufacturing a device according to various aspects of the present invention, a portion of at least one of the first conductive surface and the second conductive surface is coplanar with the majority of the third conductive surface for bonding to the provided mounting surface.

In another method for manufacturing a device according to various aspects of the present invention, one of the sidewalls of the surface mount device is for bonding to the provided mounting surface.

In another method for manufacturing a device according to various aspects of the present invention, the circuit comprises an integrated passive device.

In another method for manufacturing a device according to various aspects of the present invention, the circuit comprises an integrated active device.

In another method for manufacturing a device according to various aspects of the present invention, the circuit comprises a filter.

Another method for manufacturing a device according to various aspects of the present invention further comprises covering at least a portion of the circuit with a passivation layer.

A system according to various aspects of the present invention comprises an apparatus including a mounting surface; and a surface mount device mounted to the mounting surface, the surface mount device comprising: a top side, a bottom side, a plurality of sidewalls, and a circuit comprising one or more layers; a first conductive surface covering a portion of one of the sidewalls, the first conductive surface for providing an input to the circuit; a second conductive surface covering a portion of one of the sidewalls, the second conductive surface for providing an output from the circuit; and a third conductive surface covering a portion of one of the sidewalls, the third conductive surface for providing an electrical ground to the circuit, wherein when the surface mount device is mounted to the mounting surface, at least one layer of the circuit is orthogonal to the mounting surface.

In another system according to various aspects of the present invention, at least two of the first conductive surface, the second conductive surface, and the third conductive surface cover respective portions of the same sidewall.

In another system according to various aspects of the present invention, each of the first conductive surface, the second conductive surface and the third conductive surface covers a portion of a different one of the plurality of sidewalls.

In another system according to various aspects of the present invention, the third conductive surface is for bonding to the provided mounting surface.

In another system according to various aspects of the present invention, a majority of the third conductive surface is for bonding to the provided mounting surface.

In another system according to various aspects of the present invention, a portion of at least one of the first conductive surface and the second conductive surface is coplanar with the majority of the third conductive surface for bonding to the provided mounting surface.

In another system according to various aspects of the present invention, one of the sidewalls of the surface mount device is for bonding to the provided mounting surface.

In another system according to various aspects of the present invention, the circuit comprises an integrated passive device.

In another system according to various aspects of the present invention, the circuit comprises an integrated active device.

In another system according to various aspects of the present invention, the circuit comprises a filter.

Another system according to various aspects of the present invention, further comprises a passivation layer covering at least a portion of the circuit.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the principles of the invention.

DETAILED DESCRIPTION OF THE INVENTION

Figure 2:
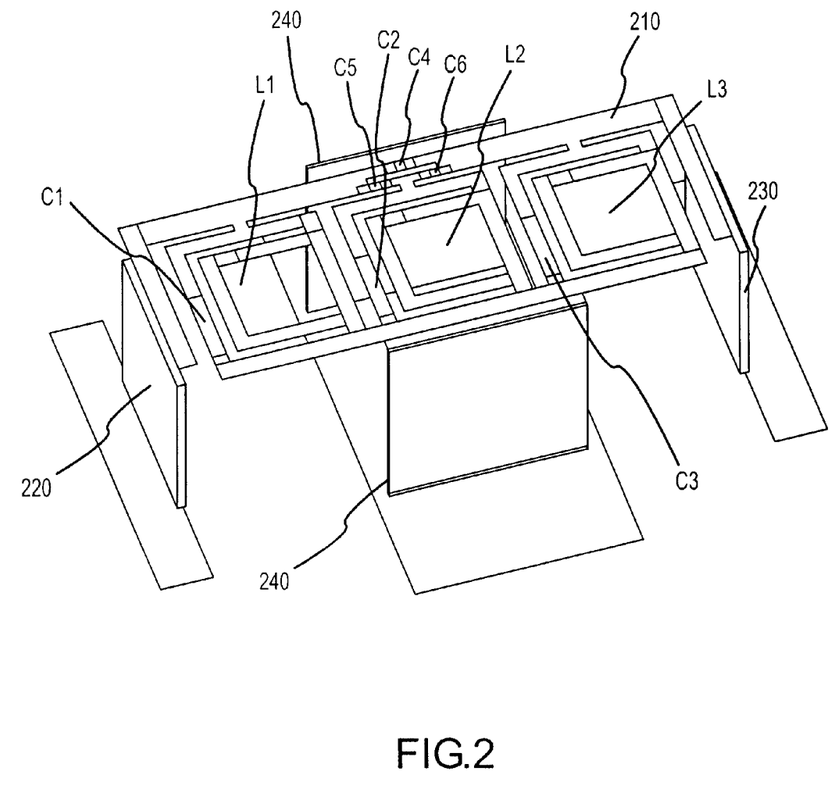
FIG. 2 is a perspective view of a prior art SMD providing a filter circuit.

FIG. 2 depicts a prior art SMD providing a filter circuit 210 residing on or near the top side of the SMD. The filter circuit 210 includes four sidewall terminals 110: an input terminal 220, an output terminal 230, and two ground terminals 240. In this example, only the ground terminal 240 in the foreground is connected to the filter circuit 210.

Figure 3:
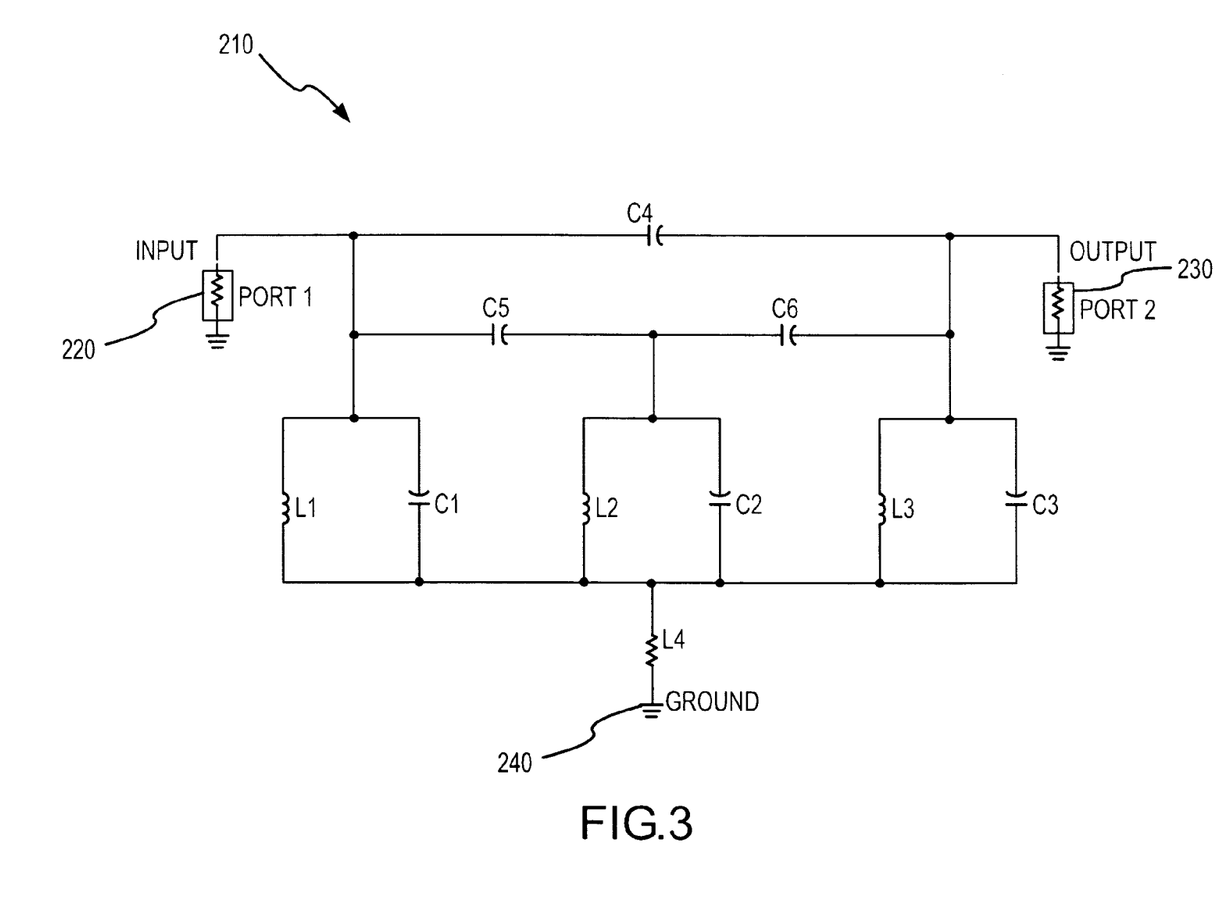
FIG. 3 is a schematic of the filter circuit in FIG. 2.
Figure 4:
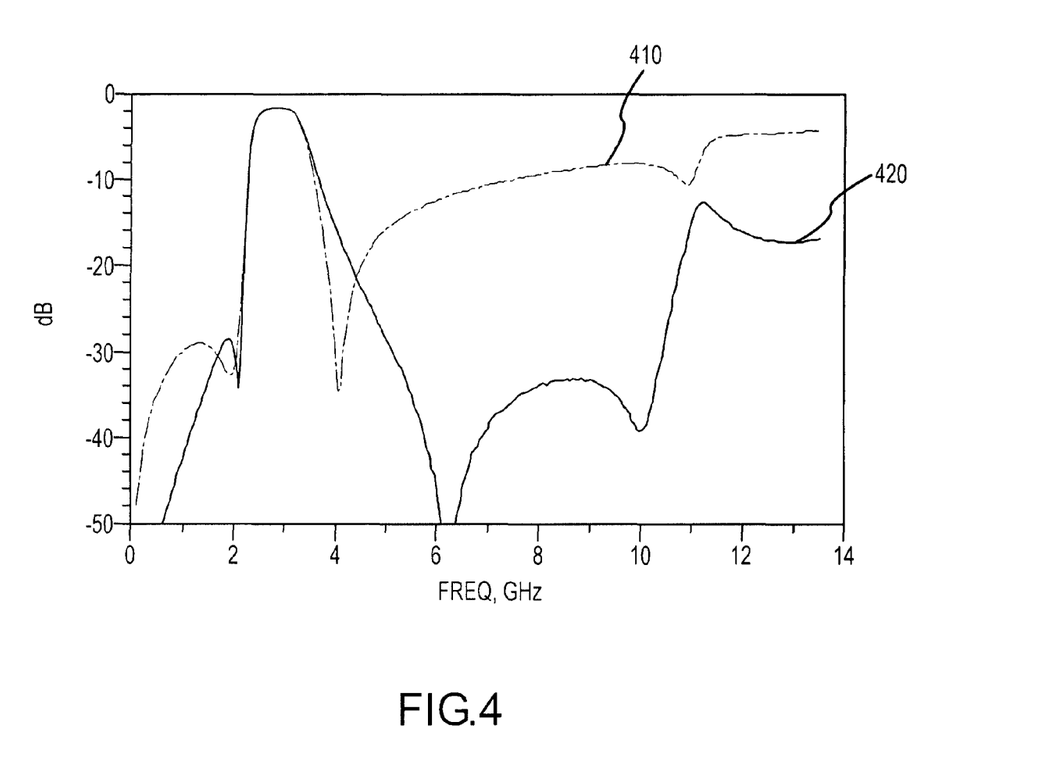
FIG. 4 depicts the frequency response of the filter circuit in FIG. 2, with and without ground lead inductance.

The schematic diagram for the filter circuit 210 in FIG. 2 is depicted in FIG. 3. The filter circuit 210 includes three resonators (L1/C1; L2/C2; and L3/C3). The inductance attributable to the ground lead 240 is represented by the inductor L4. In the case of an exemplary filter fabricated with thin-film processes to provide an SMD with side-wall terminations as depicted in FIG. 2, and having a case size of 1 mm by 0.5 mm and a substrate thickness of 0.3 mm., this ground inductance L4 is about 0.16 nH. FIG. 4 shows the frequency response for the filter circuit 210 with (410) and without (420) the 0.16 nH ground inductance L4. It can be seen that out-band rejection performance with the ground inductance L4 is considerably worse than that of the out-band rejection of the filter circuit 210 without the ground inductance L4.

Figure 5A:
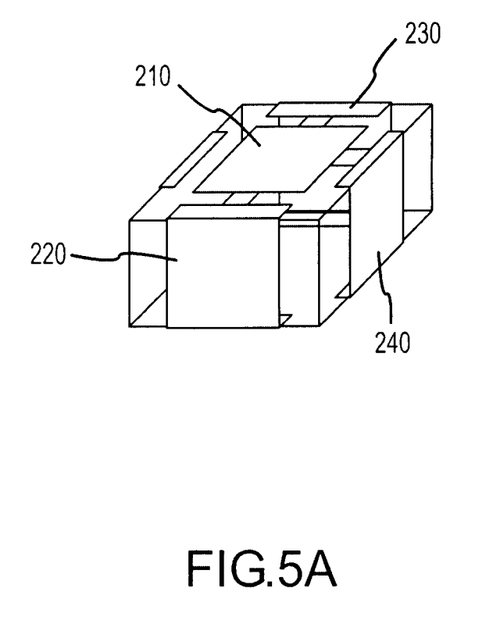
FIG. 5A is a perspective view of a prior art SMD.
Figure 5B:
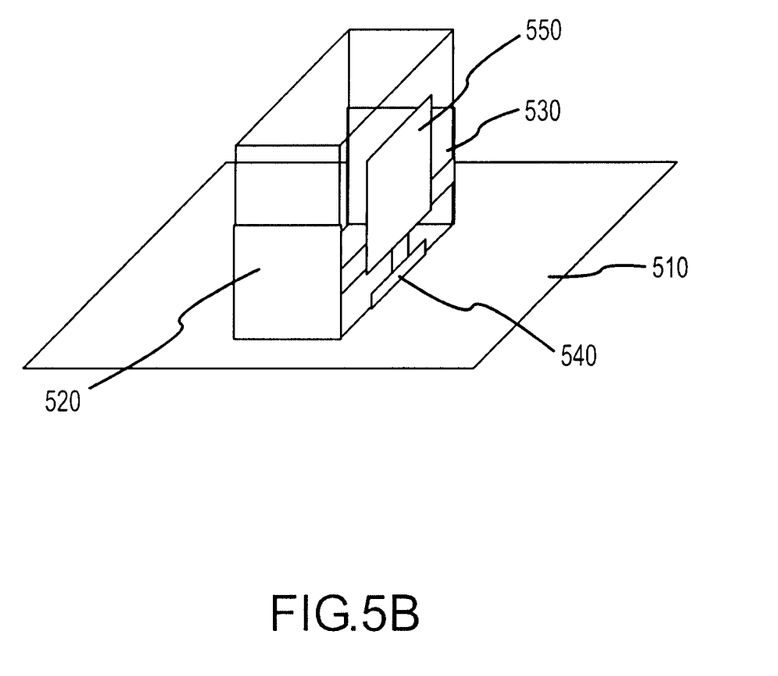
FIG. 5B is a perspective view of an exemplary embodiment of an SMD in accordance with aspects of the present invention.

An SMD may be constructed according to various aspects of the present invention to minimize lead inductance. FIG. 5A depicts a prior art SMD having an input terminal 220, an output terminal 230, and a ground terminal 240 connected to a circuit 210. In contrast, an embodiment of an SMD according to the present invention is depicted in FIG. 5B. In this exemplary embodiment, a first conductive surface serves as an input terminal 520, a second conductive surface serves as an output terminal 530, and a third conductive surface serves as a ground terminal 540. The SMD comprises a circuit 550 on or near the top surface of the SMD. The SMD is rotated such that the circuit 550 (and thus the top of the SMD) is orthogonal to the mounting surface 510.

Each conductive surface 520, 530, or 540 may cover any portion of the SMD. In the exemplary embodiment depicted in FIG. 5B, the conductive surface for the input terminal 520 covers a portion of the sidewall in the foreground (orthogonal to the mounting surface 110) and a portion of the bottom sidewall adjacent to, and coplanar with, the mounting surface 510. The conductive surface for the output terminal 530 covers a portion of the sidewall shown in FIG. 5B as the rear sidewall, as well as a portion of the sidewall adjacent to, and coplanar with, the mounting surface 510. The conductive surface for the ground terminal 540 covers a portion of the top of the SMD to connect with the circuit 550, as well as covering the sidewall of the SMD adjoining the mounting surface 510. In this exemplary embodiment, the ground terminal 540 is connected directly to the mounting surface 510, avoiding the ground inductance L4 associated with the ground terminal 540 in the conventional SMD.

Any circuit 550 may be used in conjunction with an SMD according to the present invention. The circuit 550 may serve any number of functions, have any number of leads, and may be configured in any suitable manner. For example, referring to FIG. 5C, a circuit 550 may connect to an input terminal 520, an output terminal 530, and a ground terminal 540, each comprising conductive surfaces each covering portions of the same sidewall adjacent and coplanar with the mounting surface 510 in order to minimize the inherent inductance of all three terminals 520, 530, and 540.

Figure 5C:
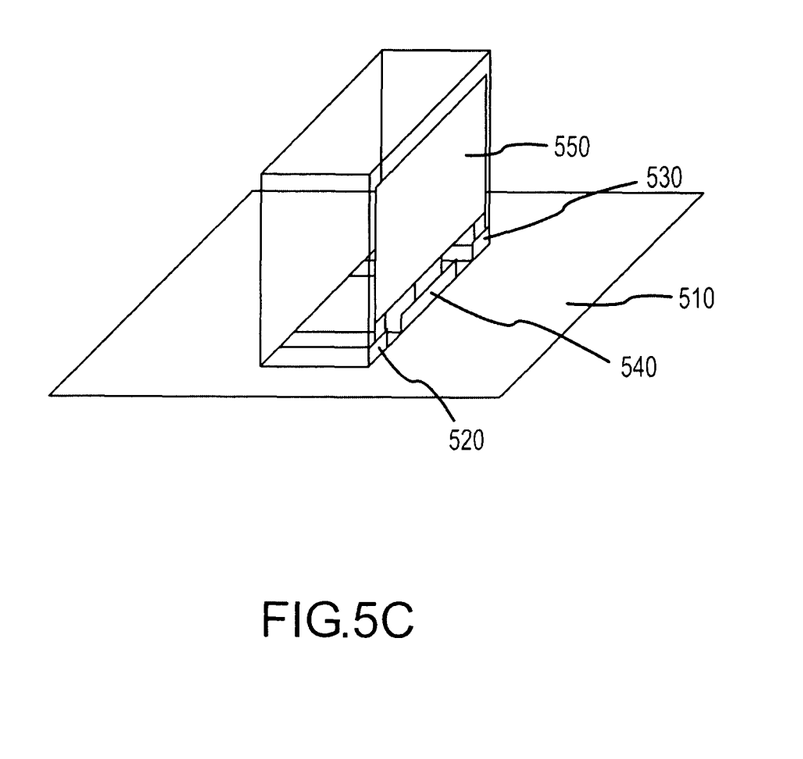
FIG. 5C is a perspective view of an exemplary embodiment of an SMD in accordance with aspects of the present invention.

The present invention may provide various other benefits. For example, in the case of a circuit 550 comprising a filter, having the bottom of the SMD in contact with air instead of the mounting surface 510 (as depicted in FIGS. 5B and 5C) may increase the quality factor (Q) of the filter to reduce insertion loss in the passband of the filter. Additionally, referring to FIG. 5C, by having leads 520, 530, and 540 on the sidewall adjacent to, and coplanar with, the mounting surface 510 may allow the dimensions of each lead to be reduced to allow additional leads to be connected to the circuit 550, where such connections may not be physically possible on a conventional SMD. The circuit may be designed and configured in any appropriate manner to operate in accordance with the present invention. For example, a circuit 550 that would connect to multiple ground terminals 240 in a conventional SMD may be configured to connect to a single ground terminal 540 for use with an SMD in accordance with the present invention.

Figure 6A:
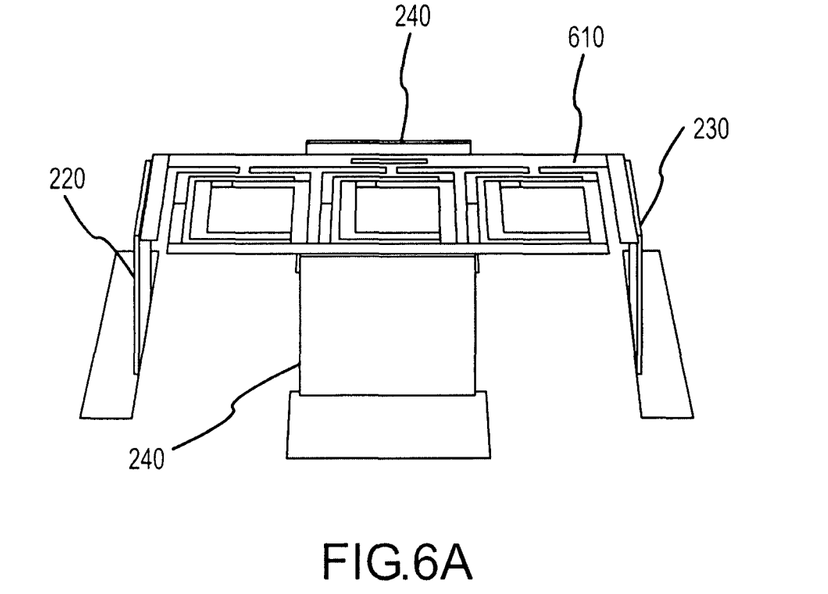
FIG. 6A is a perspective view of a prior art SMD providing a filter circuit.
Figure 6B:
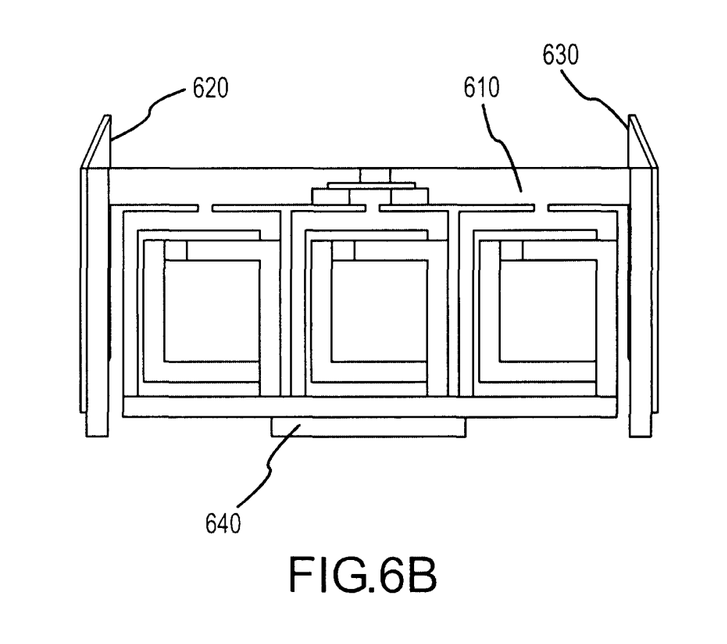
FIG. 6B is a perspective view of an exemplary embodiment of an SMD providing a filter circuit in accordance with aspects of the present invention.
Figure 7:
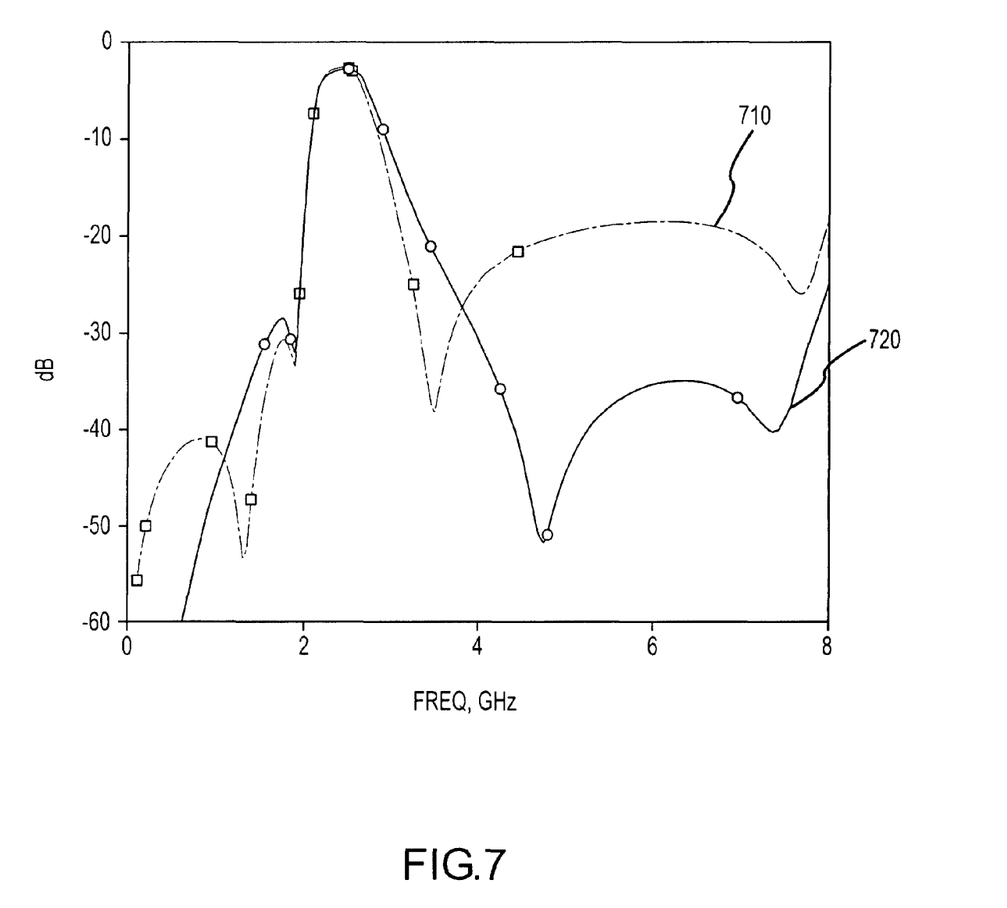
FIG. 7 depicts the frequency response of the circuits in FIGS. 6A and 6B.

Any type of SMD may utilize aspects of the present invention to minimize lead inductance. For example, FIG. 6A depicts a prior art SMD comprising an integrated passive device (IPD) providing a filter circuit 610 connected to an input terminal 220, an output terminal 230, and a ground terminal 240 in the foreground of the figure. FIG. 6B depicts an SMD providing the same filter circuit 610, but oriented to attach to a mounting surface (like mounting surface 510 shown in FIG. 5B) through an input terminal 620, an output terminal 630, and a ground terminal 640. In this example, by connecting the ground terminal 640 to the mounting surface in this manner, the inherent inductance associated with the ground terminal 640 is minimized. As shown in FIG. 7, the out-band rejection performance of the filter circuit 610 with the inductance associated with the ground terminal 240 (710) is considerably worse than that of the out-band rejection without ground terminal inductance (720). The former frequency response plot is for the filter depicted in FIG. 6A, while the latter frequency response plot is for the filter depicted in FIG. 6B. Any SMD, regardless of the type of circuitry embodied in the SMD, may utilize aspects of the present invention to minimize lead inductance.

Figure 8:
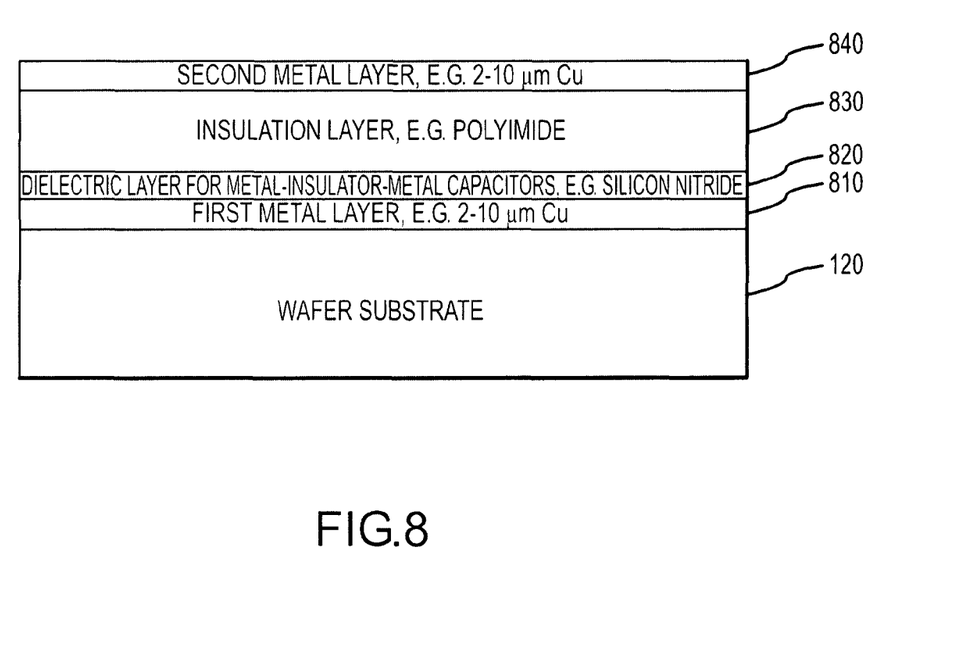
FIG. 8 is a side view of an SMD according to aspects of the present invention.

An SMD according to aspects of the present invention may be constructed in any manner using any appropriate materials, and may include any desired features. For example, referring to FIG. 8, an SMD according to the present invention may comprise a wafer substrate 120, a first metal layer 810, a dielectric layer 820, an insulation layer 830, and a second metal layer 840. The wafer substrate 120 may comprise any material or materials suitable for use in constructing an SMD, such as silicon, alumina, or any other appropriate material. The first and second metal layers 810, 840 may comprise any desired conductive materials, such as copper, gold, aluminum, and/or the like. The dielectric layer 820 may comprise any suitable dielectric material, such as silicon dioxide, silicon nitride, and/or the like. The insulation layer 830 may comprise any desired insulating material, such as polyimide.

Figure 9A:
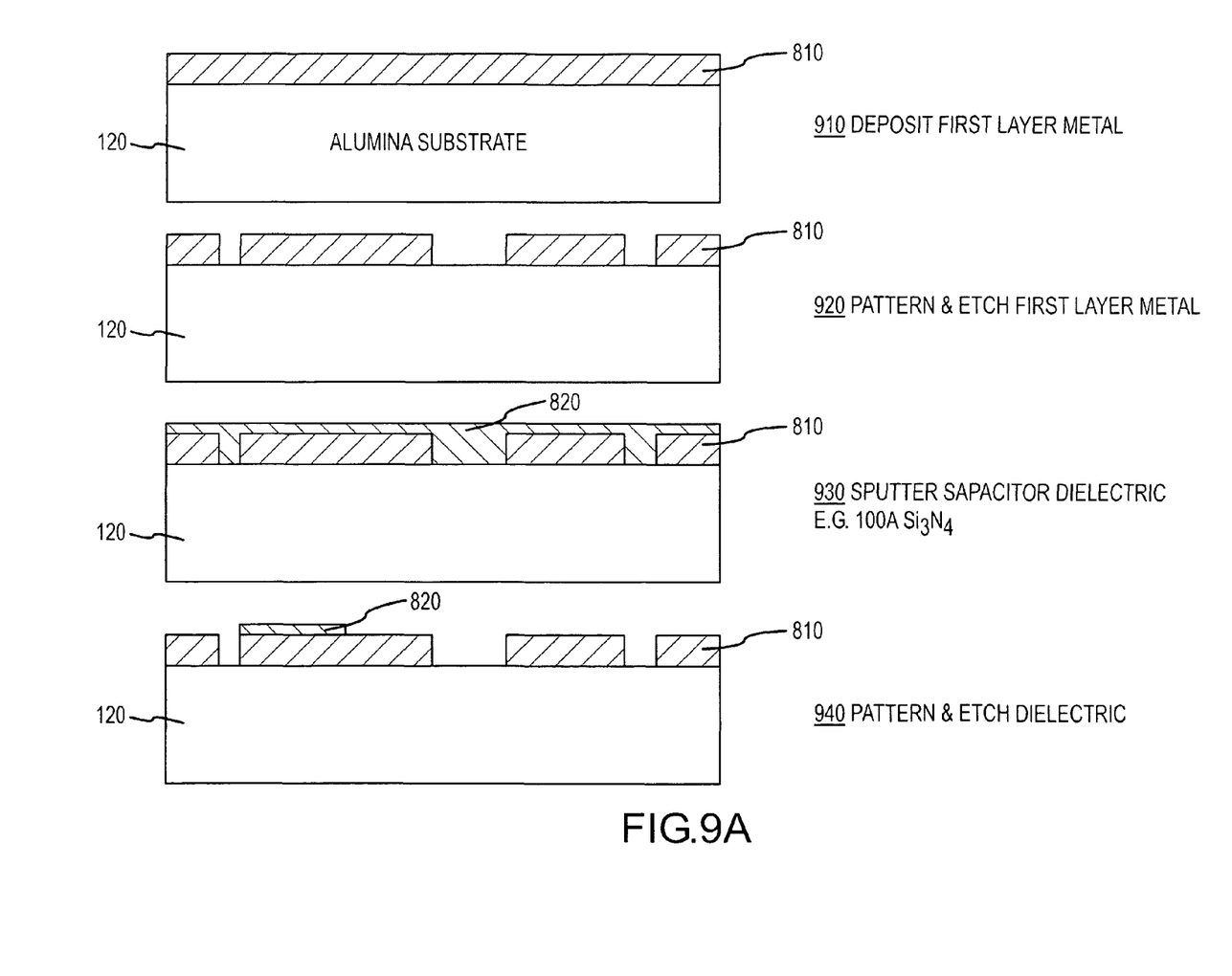
FIGS. 9A, 9B, and 10 depict exemplary processes for constructing an SMD according to aspects of the present invention.
Figure 9B:
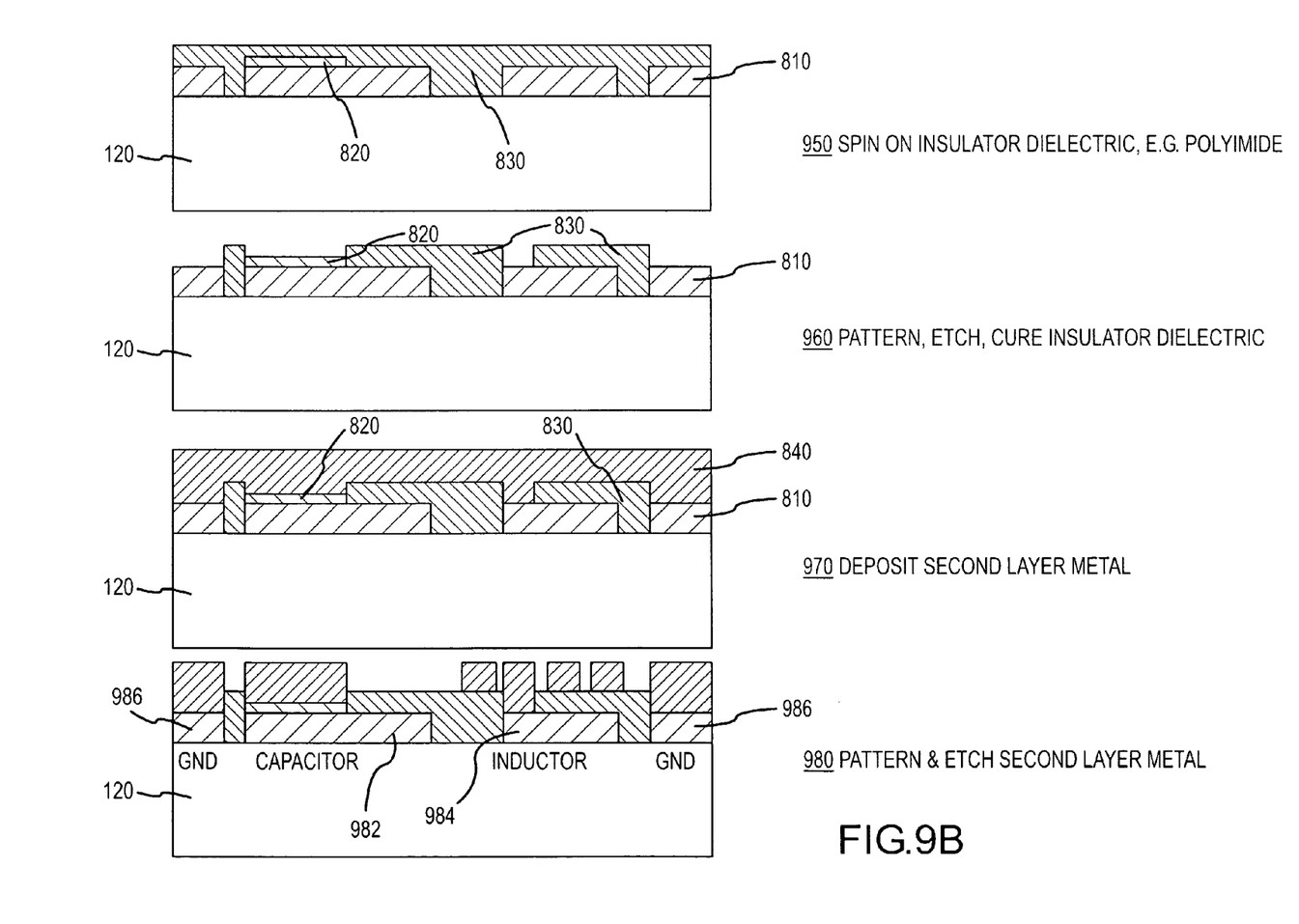

An SMD according to aspects of the present invention may be constructed in any manner. An exemplary process for constructing an SMD according to the present invention is depicted in FIGS. 9A and 9B. In this exemplary process, a first metal layer 810 may be deposited on an alumina substrate 120 (910). The first metal layer 810 is patterned and etched (920), and a dielectric layer 820 added (930). The dielectric layer 820 is patterned and etched (940), and an insulation layer 830 is added (950). The insulator layer 830 is patterned, etched, and cured (960) and a second metal layer 840 is added (970). The second metal layer 840 is patterned and etched (980). The exemplary process depicted in FIGS. 9A and 9B may be employed to fabricate an SMD comprising a capacitor 982, an inductor 984, and two grounding points 986. More generally, the above-depicted process may be employed to fabricate any circuit that is embodied in an SMD, including the previously-shown and described conductive surfaces to connect the circuit to a mounting surface.

Figure 10:
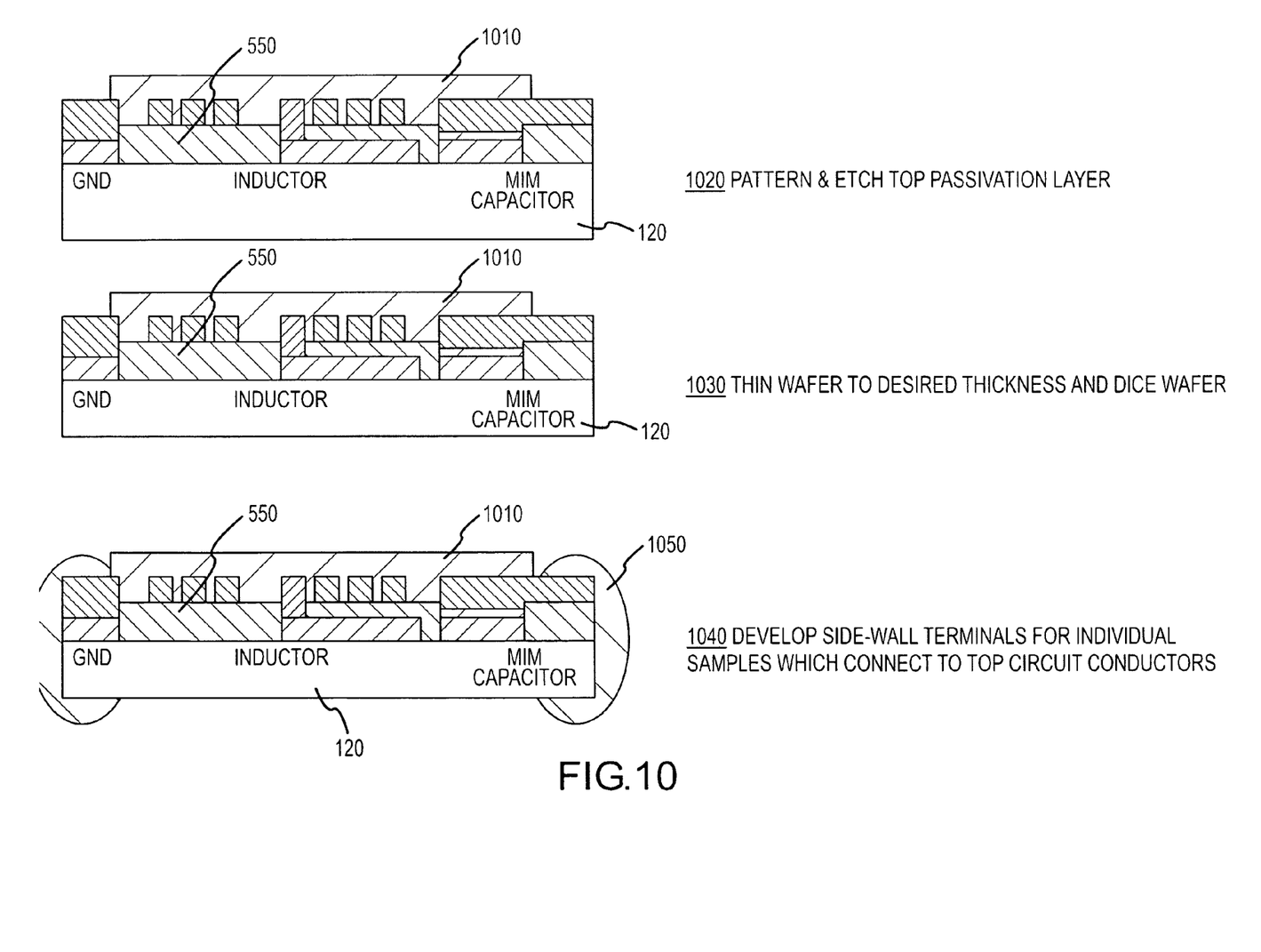

Referring to FIG. 10, an SMD according to the present invention may include a passivation layer 1010 protecting a circuit 550 supported by a substrate 120. The passivation layer 1010 may comprise any composition, such as $Si_3N_4$, $Al_2O_3$, and/or any other suitable material. In one exemplary embodiment, the passivation layer 1010 is a solder mask to prevent solder from spreading onto the circuit. The passivation layer 1010 may be used to achieve any other suitable purpose.

The passivation layer 1010 may be added to an SMD as part of the manufacturing process for the SMD. For example, referring again to FIG. 10, the passivation layer 1010 may be added to an SMD and patterned and etched (1020). The wafer substrate 120 may be thinned to any appropriate thickness and then diced (1030). Sidewall terminations 1050 may be added onto the SMD (1040) at any time desired. The sidewall terminations 1050 depicted in the last of the three cross-sectional views in FIG. 10 are analogous to those shown in FIGS. 5b and 5C. The processes described in FIGS. 9A, 9B and 10 are exemplary only. Elements of an SMD according to the present invention may be constructed in any other suitable manner.

An SMD according to the present invention may be mounted on any desired mounting surface 510. For example, in one embodiment of the present invention the SMD connects to a printed circuit board, however, the mounting surface 510 may comprise any mounting surface, such as a substrate. The mounting surface 510 may be of any dimension and may be constructed using any method of manufacture. The mounting surface 510 may operate as part of a larger system and/or in conjunction with any number of other systems and devices. Any number of SMDs in accordance with the present invention may be utilized in conjunction with a mounting surface 510.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A device, comprising:
a surface mount device having a top side, a bottom side, a plurality of sidewalls, and a circuit comprising at least a thin metal layer, a thin insulation layer and a thin dielectric layer, wherein the thin metal layer, the thin insulation layer and the thin dielectric layer form a stack of layers each layer of which lies in a respective plane that is parallel to the other layers in the stack of layers;
a first conductive surface covering a portion of one of the sidewalls, the first conductive surface for providing an input to the circuit;
a second conductive surface covering a portion of one of the sidewalls, the second conductive surface for providing an output from the circuit; and
a third conductive surface covering a portion of one of the sidewalls, the third conductive surface for providing an electrical ground to the circuit, wherein when the surface mount device is mounted to a provided mounting surface, at least one layer of the circuit is orthogonal to the provided mounting surface, wherein the thin insulation layer is orthogonal to the provided mounting surface, wherein the thin dielectric layer is orthogonal to the provided mounting surface, wherein the thin metal layer is orthogonal to each of the plurality of sidewalls, wherein the first conductive surface and the second conductive surface are orthogonal to the third conductive surface, wherein the third conductive surface is mounted to the provided mounting service, and wherein the circuit comprises a filter circuit comprising a plurality of resonators.

2. The device of claim 1, wherein at least two of the first conductive surface, the second conductive surface, and the third conductive surface cover respective portions of the same sidewall.

3. The device of claim 1, wherein each of the first conductive surface, the second conductive surface and the third conductive surface covers a portion of a different one of the plurality of sidewalls.

4. The device of claim 1, wherein the third conductive surface is for bonding to the provided mounting surface.

5. The device of claim 1, wherein a majority of the third conductive surface is for bonding to the provided mounting surface.

6. The device of claim 5, wherein a portion of at least one of the first conductive surface and the second conductive surface is coplanar with the majority of the third conductive surface for bonding to the provided mounting surface.

7. The device of claim 1, wherein one of the sidewalls of the surface mount device is for bonding to the provided mounting surface.

8. The device of claim 1, wherein the circuit comprises an integrated passive device.

9. The device of claim 1, wherein the circuit comprises an integrated active device.

10. The device of claim 1, wherein the circuit comprises a filter.

11. The device of claim 1, further comprising a passivation layer covering at least a portion of the circuit.

12. The system of claim 1, wherein:
at least a portion of the circuit and a portion of the third conductive surface providing the electrical ground are located on the same side or the same sidewall of the device; and
at least a portion of the third conductive surface providing the electrical ground is located between a portion of the circuit and a portion of the provided mounting surface.

13. A method for manufacturing a device, comprising:
providing a surface mount device, wherein the surface mount device comprises a top side, a bottom side, a plurality of sidewalls, and a circuit comprising at least a thin metal layer, a thin insulation layer and a thin dielectric layer, wherein the thin metal layer, the thin insulation layer and the thin dielectric layer form a stack of layers each layer of which lies in a respective plane that is parallel to the other layers in the stack of layers;
covering a portion of one of the sidewalls with a first conductive surface, the first conductive surface for providing an input to the circuit;
covering a portion of one of the sidewalls with a second conductive surface, the second conductive surface for providing an output from the circuit; and
covering a portion of one of the sidewalls with a third conductive surface, the third conductive surface for providing an electrical ground to the circuit, wherein when the surface mount device is mounted to a provided mounting surface, at least one layer of the circuit is orthogonal to the provided mounting surface, wherein the thin insulation layer is orthogonal to the provided mounting surface, wherein the thin dielectric layer is orthogonal to the provided mounting surface, wherein the thin metal layer is orthogonal to each of the plurality of sidewalls, wherein the first conductive surface and the second conductive surface are orthogonal to the third conductive surface, wherein the third conductive surface is mounted to the provided mounting service, and wherein the circuit comprises a filter circuit comprising a plurality of resonators.

14. The method of claim 13, wherein at least two of the first conductive surface, second conductive surface, and the third conductive surface cover respective portions of the same sidewall.

15. The method of claim 13, wherein each of the first conductive surface, the second conductive surface and the third conductive surface covers a portion of a different one of the plurality of sidewalls.

16. The method of claim 13, wherein the third conductive surface is for bonding to the provided mounting surface.

17. The method of claim 16, wherein a majority of the third conductive surface is for bonding to the provided mounting surface.

18. The method of claim 17, wherein a portion of at least one of the first conductive surface and the second conductive surface is coplanar with the majority of the third conductive surface for bonding to the provided mounting surface.

19. The method of claim 13, wherein one of the sidewalls of the surface mount device is for bonding to the provided mounting surface.

20. The method of claim 13, wherein the circuit comprises an integrated passive device.

21. The method of claim 13, wherein the circuit comprises an integrated active device.

22. The method of claim 13, wherein the circuit comprises a filter.

23. The method of claim 13, further comprising covering at least a portion of the circuit with a passivation layer.

24. The method of claim 13, wherein:
at least a portion of the circuit and a portion of the third conductive surface providing the electrical ground are located on the same side or the same sidewall of the device; and
at least a portion of the third conductive surface providing the electrical ground is located between a portion of the circuit and a portion of the provided mounting surface.

25. A system, comprising:
an apparatus including a mounting surface; and
a surface mount device mounted to the mounting surface, the surface mount device comprising:
a top side, a bottom side, a plurality of sidewalls, and a circuit comprising at least a thin metal layer, a thin insulation layer and a thin dielectric layer, wherein the thin metal layer, the thin insulation layer and the thin dielectric layer form a stack of layers each layer of which lies in a respective plane that is parallel to the other layers in the stack of layers;
a first conductive surface covering a portion of one of the sidewalls, the first conductive surface for providing an input to the circuit;
a second conductive surface covering a portion of one of the sidewalls, the second conductive surface for providing an output from the circuit; and
a third conductive surface covering a portion of one of the sidewalls, the third conductive surface for providing an electrical ground to the circuit, wherein when the surface mount device is mounted to the mounting surface, at least one layer of the circuit is orthogonal to the mounting surface, wherein the thin insulation layer is orthogonal to the provided mounting surface, wherein the thin dielectric layer is orthogonal to the provided mounting surface, wherein the thin metal layer is orthogonal to each of the plurality of sidewalls, wherein the first conductive surface and the second conductive surface are orthogonal to the third conductive surface, wherein the third conductive surface is mounted to the provided mounting service, and wherein the circuit comprises a filter circuit comprising a plurality of resonators.

26. The system of claim 25, wherein at least two of the first conductive surface, the second conductive surface, and the third conductive surface cover respective portions of the same sidewall.

27. The system of claim 25, wherein each of the first conductive surface, the second conductive surface and the third conductive surface covers a portion of a different one of the plurality of sidewalls.

28. The system of claim 25, wherein the third conductive surface is for bonding to the provided mounting surface.

29. The system of claim 28, wherein a majority of the third conductive surface is for bonding to the provided mounting surface.

30. The system of claim 29, wherein a portion of at least one of the first conductive surface and the second conductive surface is coplanar with the majority of the third conductive surface for bonding to the provided mounting surface.

31. The system of claim 25, wherein one of the sidewalls of the surface mount device is for bonding to the provided mounting surface.

32. The system of claim 25, wherein the circuit comprises an integrated passive device.

33. The system of claim 25, wherein the circuit comprises an integrated active device.

34. The system of claim 25, wherein the circuit comprises a filter.

35. The system of claim 25, further comprising a passivation layer covering at least a portion of the circuit.

36. The system of claim 25, wherein:
at least a portion of the circuit and a portion of the third conductive surface providing the electrical ground are located on the same side or the same sidewall of the device; and
at least a portion of the third conductive surface providing the electrical ground is located between a portion of the circuit and a portion of the provided mounting surface.

* * * * *